(12) United States Patent
Yoshida

(10) Patent No.: US 11,424,351 B2
(45) Date of Patent: Aug. 23, 2022

(54) SEMICONDUCTOR DEVICE AND METHOD OF MANUFACTURING SEMICONDUCTOR DEVICE

(71) Applicant: FUJI ELECTRIC CO., LTD., Kanagawa (JP)

(72) Inventor: Soichi Yoshida, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 328 days.

(21) Appl. No.: 16/830,291

(22) Filed: Mar. 26, 2020

(65) Prior Publication Data
US 2020/0365715 A1  Nov. 19, 2020

(30) Foreign Application Priority Data
May 14, 2019  (JP) .............................. JP2019-091729

(51) Int. Cl.
| H01L 29/739 | (2006.01) |
| H01L 29/10 | (2006.01) |
| H01L 29/423 | (2006.01) |
| H01L 27/06 | (2006.01) |
| H01L 21/266 | (2006.01) |

(Continued)

(52) U.S. Cl.
CPC ........ *H01L 29/7397* (2013.01); *H01L 21/266* (2013.01); *H01L 21/26513* (2013.01); *H01L 27/0629* (2013.01); *H01L 27/0727* (2013.01); *H01L 29/1095* (2013.01); *H01L 29/167* (2013.01); *H01L 29/36* (2013.01);

(Continued)

(58) Field of Classification Search
CPC ... H01L 29/7397; H01L 29/167; H01L 29/36; H01L 29/4236; H01L 29/66348; H01L 29/407; H01L 21/26513; H01L 27/0629; H01L 27/0727
See application file for complete search history.

(56) References Cited

U.S. PATENT DOCUMENTS

| 10,056,450 B2 | 8/2018 | Kouno |
| 2012/0043582 A1 | 2/2012 | Koyama |

(Continued)

FOREIGN PATENT DOCUMENTS

| JP | 2011166052 A | 8/2011 |
| JP | 2012043891 A | 3/2012 |

(Continued)

*Primary Examiner* — Joseph C. Nicely

(57) ABSTRACT

A semiconductor device is provided, including: a semiconductor substrate having a first conductivity type of drift region; a transistor section having a gate trench section on an upper surface of the semiconductor substrate; a diode section having a first conductivity type of cathode region on a lower surface of the semiconductor substrate, the cathode region having a higher doping concentration than the drift region; and a buffering region arranged between the transistor section and the diode section, the diode section having a first upper surface side lifetime control region where a first valley portion is provided in a carrier lifetime distribution in a depth direction of the semiconductor substrate, and the buffering region having a second upper surface side lifetime control region where a second valley portion is provided in the carrier lifetime distribution, the second valley portion being wider, in the depth direction, than the first valley portion.

10 Claims, 8 Drawing Sheets

(51) Int. Cl.
  *H01L 29/167*    (2006.01)
  *H01L 29/66*     (2006.01)
  *H01L 21/265*    (2006.01)
  *H01L 29/36*     (2006.01)
  *H01L 27/07*     (2006.01)
  *H01L 29/40*     (2006.01)

(52) U.S. Cl.
  CPC ........ *H01L 29/407* (2013.01); *H01L 29/4236* (2013.01); *H01L 29/66348* (2013.01)

(56) References Cited

U.S. PATENT DOCUMENTS

| | | | |
|---|---|---|---|
| 2018/0182754 A1 | 6/2018 | Naito | |
| 2019/0326118 A1* | 10/2019 | Naito | H01L 29/083 |
| 2020/0357903 A1* | 11/2020 | Kubouchi | H01L 27/06 |
| 2021/0398811 A1* | 12/2021 | Kamimura | H01L 29/0619 |
| 2022/0109062 A1* | 4/2022 | Kimura | H01L 29/7397 |

FOREIGN PATENT DOCUMENTS

| | | | |
|---|---|---|---|
| JP | 2015185742 A | 10/2015 | |
| JP | 2018006420 A | 1/2018 | |
| WO | 2017155122 A1 | 9/2017 | |

* cited by examiner

SEMICONDUCTOR DEVICE AND METHOD OF MANUFACTURING SEMICONDUCTOR DEVICE

The contents of the following Japanese patent applications are incorporated herein by reference:
NO. 2019-091729 filed in JP on May 14, 2019.

BACKGROUND

1. Technical Field

The present invention relates to a semiconductor device and a method of manufacturing a semiconductor device.

2. Related Art

In the related art, in a semiconductor device in which a transistor such as an insulated gate bipolar transistor (IGBT) and a diode such as a freewheeling diode (FWD) are provided on the same substrate, a technique in which an impurity is implanted into the substrate to form a defect or the like such that a carrier lifetime is reduced, is known (for example, see Patent Literatures 1 to 3).

CITATION LIST

Patent Literature

[Patent Literature 1] Japanese Unexamined Patent Application Publication No. 2012-43891 (JP-2012-43891A)
[Patent Literature 2] Japanese Unexamined Patent Application Publication No. 2018-6420 (JP-2018-6420A)
[Patent Literature 3] Japanese Unexamined Patent Application Publication No. 2011-166052 (JP-2011-166052A)

SUMMARY

Technical Problem

In order to suppress a hole injection from a transistor to a diode, it is conceivable to provide a buffering region between the transistor and the diode so as to form a low lifetime region in the buffering region. However, as an area of the buffering region is larger to sufficiently suppress the hole injection, a chip size is larger.

Means to Solve the Problem

In order to solve the above problem, a first aspect of the present invention provides a semiconductor device including a semiconductor substrate having a first conductivity type of drift region. The semiconductor device may include a transistor section having a gate trench section on an upper surface of the semiconductor substrate. The semiconductor device may include a diode section having a first conductivity type of cathode region on a lower surface of the semiconductor substrate, the cathode region having a higher doping concentration than the drift region. The semiconductor device may include a buffering region arranged between the transistor section and the diode section. The diode section may have a first upper surface side lifetime control region where a first valley portion is provided in a carrier lifetime distribution in a depth direction of the semiconductor substrate. The buffering region may have a second upper surface side lifetime control region where a second valley portion is provided in the carrier lifetime distribution, the second valley portion being wider, in the depth direction, than the first valley portion.

The first upper surface side lifetime control region may include a first impurity. The second upper surface side lifetime control region may include a second impurity different from the first impurity.

A concentration distribution of the first impurity in the depth direction may have a first peak portion. A concentration distribution of the second impurity in the depth direction may have a second peak portion, the second peak portion being wider than the first peak portion.

The first impurity may be helium. The second impurity may be a proton.

The second upper surface side lifetime control region may include the same impurity as the first upper surface side lifetime control region.

The number of peaks of an impurity concentration distribution in the second upper surface side lifetime control region may be more than the number of peaks of an impurity concentration distribution in the first upper surface side lifetime control region.

In the transistor section, a carrier lifetime at the same depth position as the second valley portion may be longer than a carrier lifetime in the second valley portion.

A distance between a lower end of the second upper surface side lifetime control region and the lower surface of the semiconductor substrate may be shorter than a distance between a lower end of the first upper surface side lifetime control region and the lower surface of the semiconductor substrate.

A second aspect of the present invention provides a semiconductor device including a semiconductor substrate having a first conductivity type of drift region. The semiconductor device may include a transistor section having a gate trench section on an upper surface of the semiconductor substrate. The semiconductor device may include a diode section having a first conductivity type of cathode region on a lower surface of the semiconductor substrate, the cathode region having a higher doping concentration than the drift region. The semiconductor device may include a buffering region arranged between the transistor section and the diode section. The diode section may have a first upper surface side lifetime control region where a first valley portion is provided in a carrier lifetime distribution in a depth direction of the semiconductor substrate. The buffering region may have a second upper surface side lifetime control region where a second valley portion is provided in the carrier lifetime distribution. The first upper surface side lifetime control region may include a first impurity. The second upper surface side lifetime control region may include a second impurity different from the first impurity.

A third aspect of the present invention provides a method of manufacturing a semiconductor device including a semiconductor substrate having a first conductivity type of drift region; a transistor section having a gate trench section on an upper surface of the semiconductor substrate; a diode section having a first conductivity type of cathode region on a lower surface of the semiconductor substrate, the cathode region having a higher doping concentration than the drift region; and a buffering region arranged between the transistor section and the diode section. The method may include implanting an impurity into each of the diode section and the buffering region under different conditions. The method may include annealing the semiconductor substrate to form, in the diode section, a first upper surface side lifetime control region where a first valley portion is provided in a carrier lifetime distribution in a depth direction of the semiconductor substrate, and to form, in the buffering region, a second upper surface side lifetime control region where a second valley portion is provided in the carrier lifetime distribution, the second valley portion being wider than the first valley portion.

The summary clause above described does not necessarily describe all necessary features of the embodiments of the present invention. The present invention may also be a sub-combination of the features described above.

DESCRIPTION OF EXEMPLARY EMBODIMENTS

Figure 1:
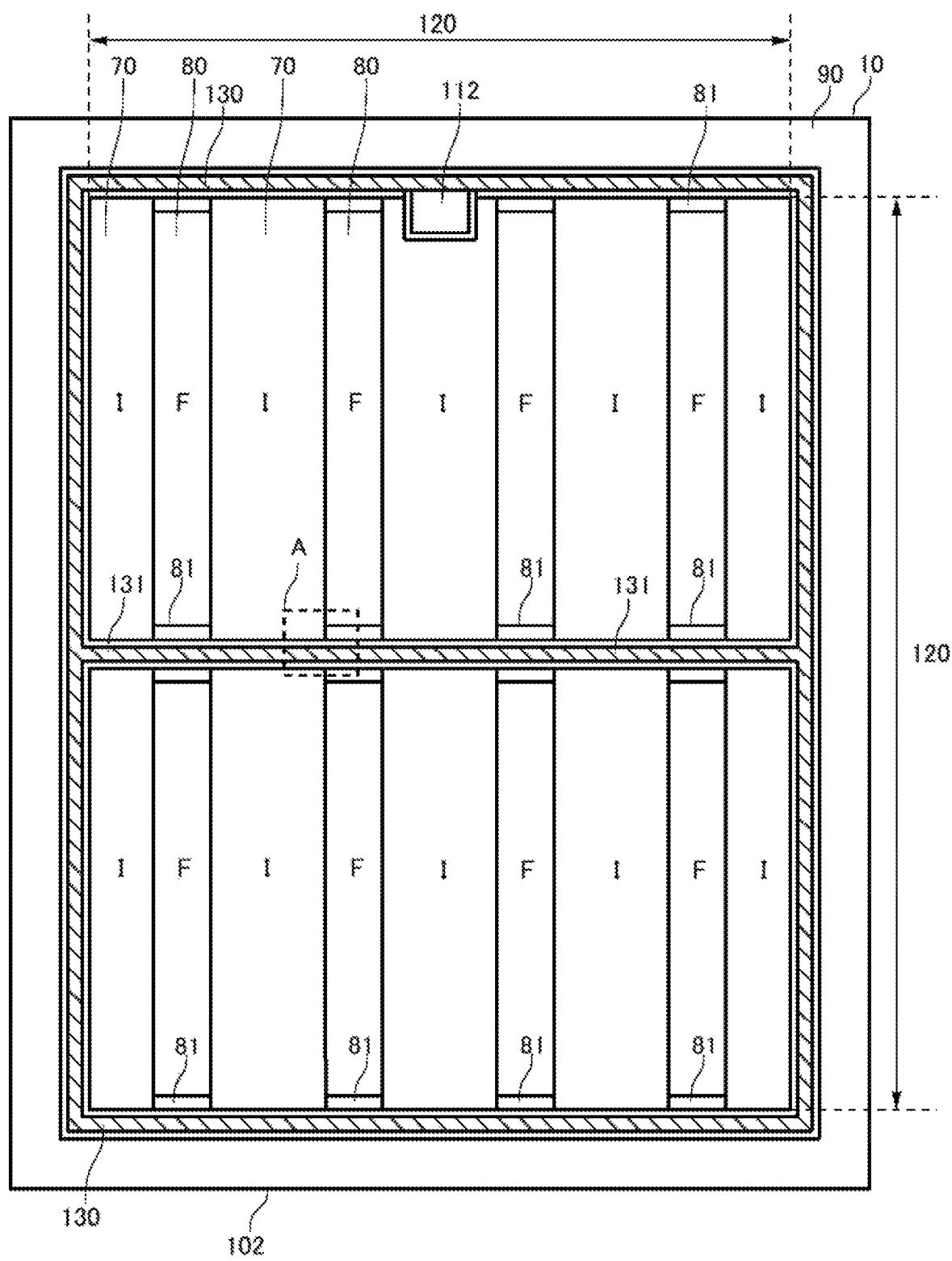
FIG. 1 is a top plan view showing an example of a semiconductor device 100 according to one embodiment of the invention.

Hereinafter, the present invention will be described through embodiments of the invention, but the following embodiments do not limit the invention according to the claims. Further, not all the combinations of features described in the embodiments are essential for means to solve the problem in the invention.

In the specification, one side in a direction parallel to a depth direction of a semiconductor substrate is referred to as "upper", and the other side is referred to as "lower". Of two principal surfaces of a substrate, a layer or another member, one surface is referred to as an upper surface and the other surface is referred to as a lower surface. An "upper" and "lower" direction is not limited to a direction of gravity, or a direction in which the semiconductor device is mounted.

In the specification, technical matters may be described using orthogonal coordinate axes of an X axis, a Y axis, and a Z axis. The orthogonal coordinate axes merely specify relative positions of components and do not limit a specific direction. For example, a direction that the Z axis shows is not limited to a height direction with respect to a ground. Note that a +Z axis direction and a −Z axis direction are directions opposite to each other. In a case where the Z axis direction is described without a description of positive and negative signs, the direction means a direction parallel to the +Z axis and the −Z axis. Further, in the specification, a case of viewing from the +Z axis direction may be referred to as a top plan view.

In the specification, a case where a term such as "same" or "equal" is mentioned may include an error due to a variation in manufacturing or the like. The error is, for example, within 10%.

In the specification, a conductivity type of doping region where doping has been carried out with an impurity is described as a P type or an N type. Note that conductivity types of respective doping regions may be of opposite polarities, respectively. Further, in the specification, a description of a P+ type or an N+ type means a higher doping concentration than that of the P type or the N type, and a description of a P− type or an N− type means a lower doping concentration than that of the P type or the N type. Further, in the specification, a description of a P++ type or an N++ type means a higher doping concentration than that of the P+ type or the N+ type.

In the specification, the doping concentration indicates a concentration of an impurity activated as a donor or an acceptor. In the specification, a concentration difference between the donor and acceptor may be set to be the doping concentration. The concentration difference can be measured by a voltage-capacitance measurement method (CV method). Further, a carrier concentration measured by a spreading resistance measurement (SR) method may be set to be the doping concentration. In a case where a doping concentration distribution has a peak in a region, the peak value may be set to be the doping concentration in the region. In a case where the doping concentration is substantially uniform in a region where the donor or the acceptor is present, or the like, an average value of the doping concentration may be set to be the doping concentration in the region. Further, in the specification, a dopant concentration indicates a concentration of each of the donor and the acceptor.

In the specification, an impurity concentration may be used as an impurity concentration regardless of whether or not the impurity is activated. The impurity concentration can be measured by the CV method, for example. The concentration of the impurity which functions as the donor or the acceptor by the activation may be measured by the SR method.

FIG. 1 is a top plan view showing an example of a semiconductor device 100 according to one embodiment of the invention. FIG. 1 shows a position at which each member is projected on an upper surface of a semiconductor substrate 10. FIG. 1 shows merely some members of the semiconductor device 100, and omits some members.

The semiconductor device 100 includes the semiconductor substrate 10. The semiconductor substrate 10 is a substrate formed of a semiconductor material such as silicon or a compound semiconductor. The semiconductor substrate 10 has an edge side 102 in the top plan view. As merely referred to as the top plan view in the specification, it means that an upper surface side of the semiconductor substrate 10 is viewed from above. The semiconductor substrate 10 of this example has two sets of edge sides 102 opposite to each other in the top plan view. In FIG. 1, the X axis and the Y axis are parallel to any of the edge sides 102. Further, the Z axis is perpendicular to the upper surface of the semiconductor substrate 10.

The semiconductor substrate 10 is provided with an active section 120. The active section 120 is a region where a main current flows in the depth direction between the upper surface and a lower surface of the semiconductor substrate 10 in a case where the semiconductor device 100 is controlled to be in an on-state. An emitter electrode is provided above the active section 120, but is omitted in FIG. 1.

The active section 120 is provided with a transistor section 70 including a transistor element such as an IGBT, and a diode section 80 including a diode element such as an FWD. In FIG. 1, a region where the transistor section 70 is arranged is denoted by a symbol "I", and a region where the diode section 80 is arranged is denoted by a symbol "F". The transistor section 70 and the diode section 80 are arranged along a predetermined arrangement direction (the X axis direction in FIG. 1). The transistor section 70 and the diode section 80 may be arranged alternately in the X axis direction. In the specification, a direction perpendicular to the arrangement direction in the top plan view may be referred to as an extension direction (the Y axis direction in FIG. 1). Each of the transistor section 70 and the diode section 80 may have a longitudinal length in the extension direction. That is, for the transistor section 70, a length in the Y axis direction is greater than a width in the X axis direction. Similarly, for the diode section 80, a length in the Y axis direction is greater than a width in the X axis direction. The extension directions of the transistor section 70 and the diode section 80 may be the same as a longitudinal direction of a trench section described below.

The diode section 80 has an N+ type of cathode region in a region in contact with the lower surface of the semiconductor substrate 10. In the specification, a region where the cathode region is provided is referred to as the diode section 80. That is, the diode section 80 is a region which overlaps the cathode region in the top plan view. On the lower surface of the semiconductor substrate 10, a P+ type of collector region may be provided in a region other than the cathode region. In the specification, the diode section 80 may also include an extension region 81 where the diode section 80 extends to a gate runner described below in the Y axis direction. The collector region is provided on a lower surface of the extension region 81.

The semiconductor device 100 may have one or more pads above the semiconductor substrate 10. The semiconductor device 100 of this example has a gate pad 112. The semiconductor device 100 may have an anode pad, a cathode pad, and a current detection pad in addition to the gate pad 112. Each pad is arranged in a region close to the edge side 102. The region close to the edge side 102 refers to a region between the edge side 102 and the emitter electrode in the top plan view. When the semiconductor device 100 is mounted, each pad may be connected to an external circuit via a wiring such as a wire.

A gate potential is applied to the gate pad 112. The gate pad 112 is electrically connected to a conductive section of a gate trench section of the active section 120. The semiconductor device 100 includes a gate runner that connects the gate pad 112 and the gate trench section. In FIG. 1, the gate runner is hatched with diagonal lines.

The gate runner of this example has an outer circumferential gate runner 130 and an active-side gate runner 131. The outer circumferential gate runner 130 is arranged between the active section 120 and the edge side 102 of the semiconductor substrate 10 in the top plan view. The outer circumferential gate runner 130 of this example surrounds the active section 120 in the top plan view. A region surrounded by the outer circumferential gate runner 130 in the top plan view may be the active section 120. Further, the outer circumferential gate runner 130 is connected to the gate pad 112. The outer circumferential gate runner 130 is arranged above the semiconductor substrate 10. The outer circumferential gate runner 130 may be a metal wiring including such as aluminum.

The active-side gate runner 131 is provided in the active section 120. Providing the active-side gate runner 131 in the active section 120 can reduce a variation in wiring length from the gate pad 112 for each region of the semiconductor substrate 10.

The active-side gate runner 131 is connected to the gate trench section of the active section 120. The active-side gate runner 131 is arranged above the semiconductor substrate 10. The active-side gate runner 131 may be a wiring formed of a semiconductor such as polysilicon doped with an impurity.

The active-side gate runner 131 may be connected to the outer circumferential gate runner 130. The active-side gate runner 131 of this example is provided extending in the X axis direction so as to cross the active section 120 from one outer circumferential gate runner 130 to the other outer circumferential gate runner 130 substantially at the center of the Y axis direction.

Further, the semiconductor device 100 may include a temperature sensing section (not shown) that is a PN junction diode formed of polysilicon or the like, and a current detection section (not shown) that simulates an operation of the transistor section provided in the active section 120.

The semiconductor device 100 of this example includes an edge termination structure section 90 between the outer circumferential gate runner 130 and the edge side 102. The edge termination structure section 90 relaxes an field crowding on the upper surface side of the semiconductor substrate 10. The edge termination structure section 90 has a structure of a guard ring, a field plate, a RESURF, or combinations thereof which are provided annularly surrounding the active section 120, for example.

Figure 2:
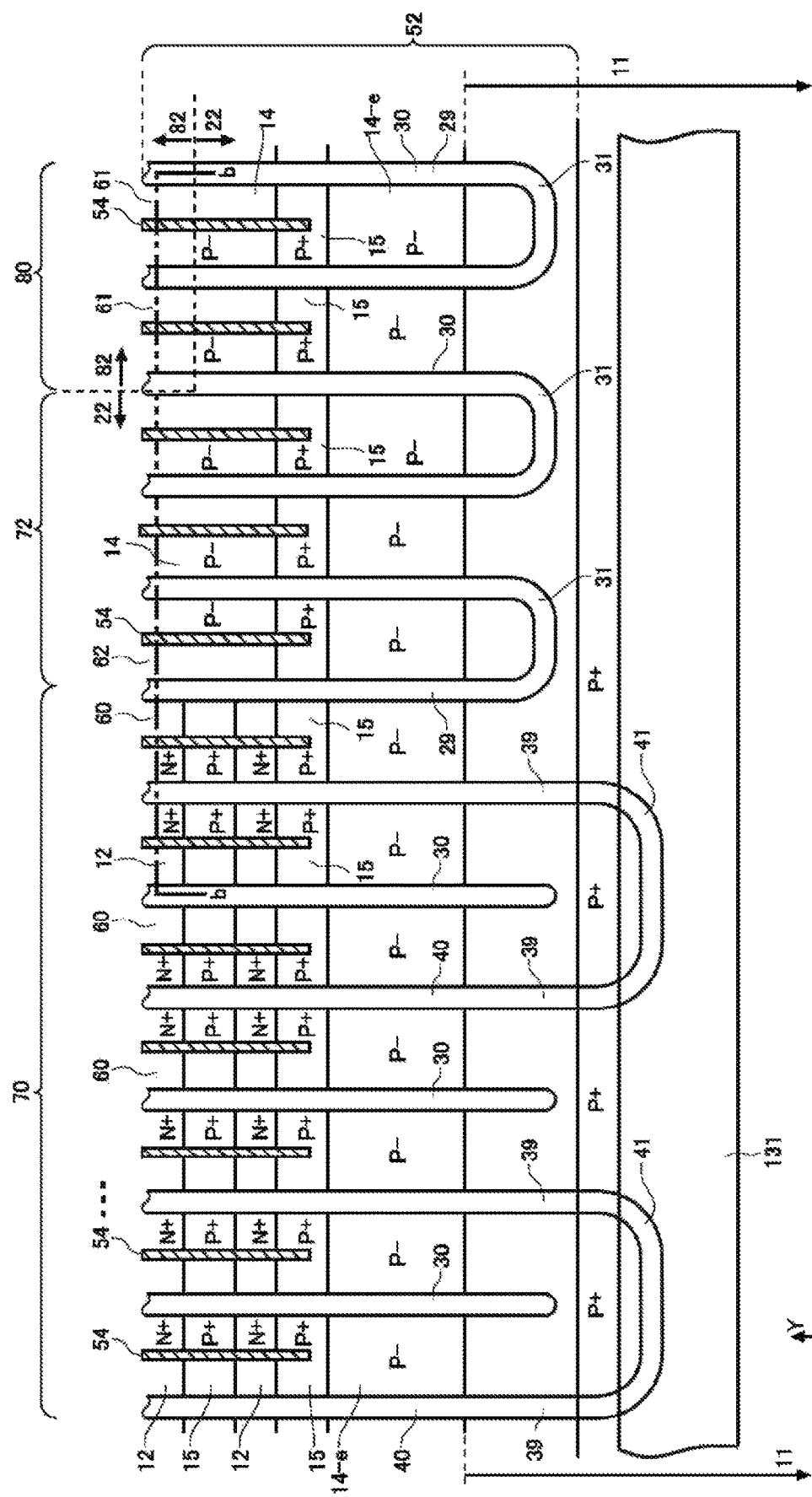
FIG. 2 is an enlarged view of a region A in FIG. 1.

FIG. 2 is an enlarged view of a region A in FIG. 1. The region A is a region including the transistor section 70, the diode section 80, and the active-side gate runner 131. The semiconductor device 100 of this example includes a buffering region 72 between the transistor section 70 and the diode section 80 that lie next to each other in the X axis direction.

The semiconductor device 100 of this example includes a gate trench section 40, a dummy trench section 30, a well region 11, an emitter region 12, a base region 14, and a contact region 15 that are provided inside the upper surface side of the semiconductor substrate 10. Each of the gate trench section 40 and the dummy trench section 30 is an example of the trench section. Further, the semiconductor device 100 of this example includes an emitter electrode 52 and the active-side gate runner 131 that are provided above the upper surface of the semiconductor substrate 10. The emitter electrode 52 and the active-side gate runner 131 are provided in isolation each other.

An interlayer dielectric film is provided between the emitter electrode 52 and the active-side gate runner 131, and the upper surface of the semiconductor substrate 10, but the interlayer dielectric film is omitted in FIG. 2. In the interlayer dielectric film of this example, a contact hole 54 is provided passing through the interlayer dielectric film. In FIG. 2, each contact hole 54 is hatched with the diagonal lines.

The emitter electrode 52 is provided above the gate trench section 40, the dummy trench section 30, the well region 11, the emitter region 12, the base region 14, and the contact region 15. The emitter electrode 52 is in contact with the emitter region 12, the contact region 15, and the base region 14 on the upper surface of the semiconductor substrate 10, through the contact hole 54. Further, the emitter electrode 52 is connected to a dummy conductive section in the dummy trench section 30 through the contact hole provided in the interlayer dielectric film. The emitter electrode 52 may be connected to the dummy conductive section of the dummy trench section 30 at an edge of the dummy trench section 30 in the Y axis direction.

The active-side gate runner 131 is connected to the gate trench section 40 through the contact hole provided in the interlayer dielectric film. The active-side gate runner 131 may be connected to a gate conductive section of the gate trench section 40 at an edge portion 41 of the gate trench section 40 in the Y axis direction. The active-side gate runner 131 is not connected to the dummy conductive section in the dummy trench section 30.

The emitter electrode 52 is formed of a material including a metal. FIG. 2 shows a range where the emitter electrode 52 is provided. For example, at least a part of a region of the emitter electrode 52 is formed of aluminum or an aluminum-silicon alloy. The emitter electrode 52 may have a barrier metal formed of titanium, a titanium compound, or the like below a region formed of aluminum or the like. Further, a plug, which is formed by embedding tungsten or the like so as to be in contact with the barrier metal and aluminum or the like, may be included in the contact hole.

The well region 11 is provided overlapping the active-side gate runner 131. The well region 11 is provided so as to extend with a predetermined width even in a range not overlapping the active-side gate runner 131. The well region 11 of this example is provided away from an end of the contact hole 54 in the Y axis direction toward the active-side gate runner 131. The well region 11 is a region that is a second conductivity type and that has a higher doping concentration than the base region 14. The base region 14 of this example is of a P– type, and the well region 11 is of a P+ type.

Each of the transistor section 70, the buffering region 72, and the diode section 80 has a plurality of trench sections arranged in the arrangement direction. The transistor section 70 of this example is alternately provided with one or more gate trench sections 40 and one or more dummy trench sections 30 along the arrangement direction. The buffering region 72 and the diode section 80 of this example are provided with a plurality of dummy trench sections 30 along the arrangement direction. The buffering region 72 and the diode section 80 of this example are not provided with the gate trench section 40.

The gate trench section 40 of this example may have two linear portions 39 extending along the extension direction perpendicular to the arrangement direction (portions of a trench that are linear along the extension direction), and the edge portion 41 connecting the two linear portions 39. The extension direction in FIG. 2 is the Y axis direction.

Preferably, at least a part of the edge portion 41 is provided in a curved shape in the top plan view. By connecting between end portions of the two linear portions 39 in the Y axis direction by the edge portion 41, it is possible to relax the field crowding at the end portions of the linear portions 39.

In the transistor section 70, the dummy trench sections 30 are provided between the respective linear portions 39 of the gate trench sections 40. Between the respective linear portions 39, one dummy trench section 30 may be provided or a plurality of dummy trench sections 30 may be provided. The dummy trench section 30 may have a linear shape extending in the extension direction, or may have linear portions 29 and an edge portion 31 similar to the gate trench section 40. The semiconductor device 100 shown in FIG. 2 includes both of the linear dummy trench section 30 having no edge portion 31, and the dummy trench section 30 having the edge portion 31.

A diffusion depth of the well region 11 may be deeper than depths of the gate trench section 40 and the dummy trench section 30. The end portions of the gate trench section 40 and the dummy trench section 30 in the Y axis direction are provided in the well region 11 in the top plan view. That is, at the end portion of each trench section in the Y axis direction, a bottom portion of each trench section in the depth direction is covered with the well region 11. This can relax the field crowding at the bottom portion of each trench section.

A mesa section is provided between the respective trench sections in the arrangement direction. The mesa section refers to a region interposed between the trench sections inside the semiconductor substrate 10. As an example, an upper end of the mesa section is the upper surface of the semiconductor substrate 10. A depth position of a lower end of the mesa section is the same as a depth position of a lower end of the trench section. The mesa section of this example is provided extending in the extension direction (the Y axis direction) along the trench, on the upper surface of the semiconductor substrate 10. In this example, the transistor section 70 is provided with a mesa section 60, the diode section 80 is provided with a mesa section 61, and the buffering region 72 is provided with a mesa section 62. As merely referred to as the mesa section in the specification, it indicates each of the mesa section 60, the mesa section 61, and the mesa section 62.

Each mesa section is provided with the base region 14. In the mesa section, a region arranged closest to the active-side gate runner 131, in the base region 14 exposed on the upper surface of the semiconductor substrate 10, is to be a base region 14-$e$. While FIG. 2 shows the base region 14-$e$ arranged at one end portion of each mesa section in the extension direction, the base region 14-$e$ is also arranged at the other end portion of each mesa section. Each mesa section may be provided with at least one of a first conductivity type of emitter region 12, and a second conductivity type of contact region 15 in a region interposed between the base regions 14-$e$ in the top plan view. In this example, the emitter region 12 is of an N+ type, and the contact region 15 is of a P+ type. The emitter region 12 and the contact region 15 may be provided between the base region 14 and the upper surface of the semiconductor substrate 10 in the depth direction.

The mesa section 60 of the transistor section 70 has the emitter region 12 exposed on the upper surface of the semiconductor substrate 10. The emitter region 12 is provided in contact with the gate trench section 40. The mesa section 60 in contact with the gate trench section 40 may be provided with the contact region 15 exposed on the upper surface of the semiconductor substrate 10.

Each of the contact region 15 and the emitter region 12 in the mesa section 60 is provided from one trench section to the other trench section in the X axis direction. As an example, the contact region 15 and the emitter region 12 in the mesa section 60 are alternately arranged along the extension direction of the trench section (the Y axis direction).

In another example, the contact region 15 and the emitter region 12 in the mesa section 60 may be provided in a stripe shape along the extension direction of the trench section (the Y axis direction). For example, the emitter region 12 is provided in a region in contact with the trench section, and the contact region 15 is provided in a region interposed between the emitter regions 12.

The mesa section 61 of the diode section 80 is not provided with the emitter region 12. The base region 14 and the contact region 15 may be provided on an upper surface of the mesa section 61. In the region interposed between the base regions 14-$e$ on the upper surface of the mesa section 61, the contact region 15 may be provided in contact with each base region 14-*e*. The base region 14 may be provided in a region interposed between the contact regions 15 on the upper surface of the mesa section 61. The base region 14 may be arranged in an entire region interposed between the contact regions 15.

The mesa section 62 of the buffering region 72 may have the same structure as the mesa section 61 of the diode section 80. In another example, the mesa section 62 may have the contact region 15 instead of at least a part of the base region 14 of the diode section 80, on the upper surface of the semiconductor substrate 10. An area of the contact region 15 on the upper surface of at least one mesa section 62 may be greater than an area of the contact region 15 on the upper surface of one mesa section 60. By increasing the area of the contact region 15 in the mesa section 62, a carrier such as a hole can be easily extracted towards an emitter electrode 52 during a turn-off or the like of the transistor section 70 is turned off.

The contact hole 54 is provided above each mesa section. The contact hole 54 is arranged in the region interposed between the base regions 14-*e*. The contact hole 54 of this example is provided above respective regions of the contact region 15, the base region 14, and the emitter region 12. The contact hole 54 is not provided in regions corresponding to the base region 14-*e* and the well region 11. The contact hole 54 may be arranged at the center of the mesa section 60 in the arrangement direction (the X axis direction).

In the diode section 80, an N+ type of cathode region 82 is provided in a region in direct contact with the lower surface of the semiconductor substrate 10. On the lower surface of the semiconductor substrate 10, a P+ type of collector region 22 may be provided in a region where the cathode region 82 is not provided. In FIG. 2, a boundary between the cathode region 82 and the collector region 22 is indicated by a dotted line.

Figure 3:
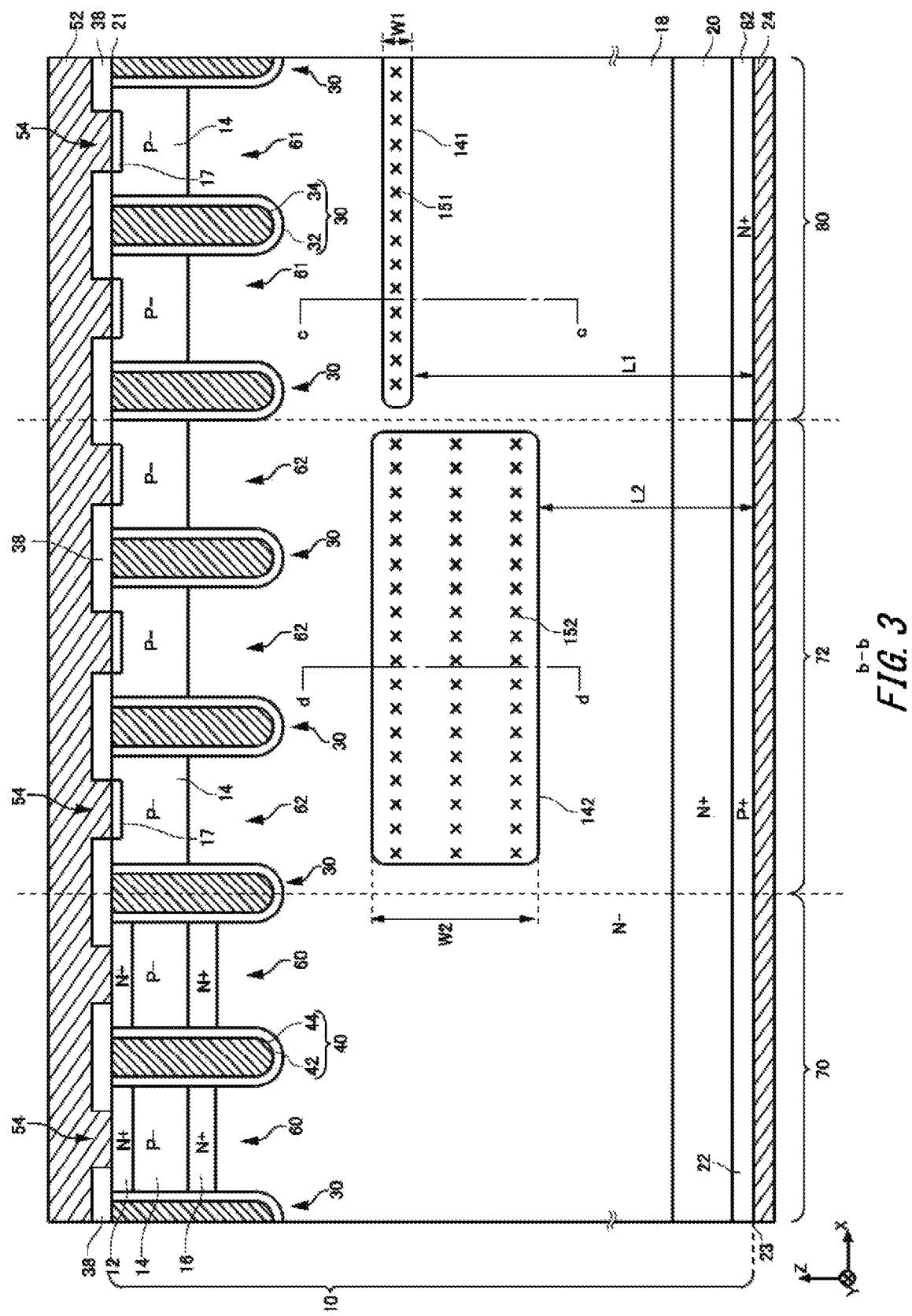
FIG. 3 is a view showing an example of a cross section b-b in FIG. 2.

FIG. 3 is a view showing an example of a cross section b-b in FIG. 2. The cross section b-b is an XZ plane passing through the emitter region 12 and the cathode region 82. The semiconductor device 100 of this example has the semiconductor substrate 10, an interlayer dielectric film 38, the emitter electrode 52, and a collector electrode 24, in the cross section. The interlayer dielectric film 38 is provided on the upper surface of the semiconductor substrate 10. The interlayer dielectric film 38 is a film including at least one layer of a dielectric film such as a silicate glass to which an impurity such as boron or phosphorus is added, a thermal oxide film, and the other dielectric films. The interlayer dielectric film 38 is provided with the contact hole 54 described in FIG. 2.

The emitter electrode 52 is provided above the interlayer dielectric film 38. The emitter electrode 52 is in contact with an upper surface 21 of the semiconductor substrate 10 through the contact hole 54 of the interlayer dielectric film 38. The collector electrode 24 is provided on a lower surface 23 of the semiconductor substrate 10. The emitter electrode 52 and the collector electrode 24 are formed of a metal material such as aluminum. In the specification, the direction in which the emitter electrode 52 is connected to the collector electrode 24 (the Z axis direction) is referred to as a depth direction.

The semiconductor substrate 10 has an N− type of drift region 18. The drift region 18 is provided in each of the transistor section 70, the buffering region 72, and the diode section 80.

In the mesa section 60 of the transistor section 70, an N+ type of emitter region 12 and a P− type of base region 14 are provided in order from an upper surface 21 side of the semiconductor substrate 10. The drift region 18 is provided below the base region 14. The mesa section 60 may be provided with an N+ type of accumulation region 16. The accumulation region 16 is arranged between the base region 14 and the drift region 18.

The emitter region 12 is exposed on the upper surface 21 of the semiconductor substrate 10 and is provided in contact with gate trench section 40. The emitter region 12 may be in contact with the trench sections on both sides of the mesa section 60. The emitter region 12 has a higher doping concentration than the drift region 18.

The base region 14 is provided below the emitter region 12. The base region 14 of this example is provided in contact with the emitter region 12. The base region 14 may be in contact with the trench sections on both sides of the mesa section 60.

The accumulation region 16 is provided below the base region 14. The accumulation region 16 has a higher doping concentration than the drift region 18. By providing the accumulation region 16 having the high concentration between the drift region 18 and the base region 14, it is possible to improve a carrier injection-enhancement effect (IE effect) and reduce an on-voltage. The accumulation region 16 may be provided to cover a whole lower surface of the base region 14 in each mesa section 60.

The mesa section 61 of the diode section 80 is provided with the P− type of base region 14 in contact with the upper surface 21 of the semiconductor substrate 10. The drift region 18 is provided below the base region 14. In the mesa section 61, the accumulation region 16 may be provided below the base region 14. The mesa section 61 may be provided with a P+ type of plug region 17 having a higher doping concentration than the base region 14 in a region exposed by the contact hole 54. The plug region 17 may have a higher doping concentration than the contact region 15. The plug region 17 may be provided also in the contact region 15. By providing the plug region 17, it is possible to reduce a contact resistance between the emitter electrode 52 and the mesa section 61.

The mesa section 62 of the buffering region 72 may have the same structure as the mesa section 61 of the diode section 80. In another example, the contact region 15 may be provided instead of at least a part of the base region 14 in the mesa section 62.

In each of the transistor section 70, the buffering region 72, and the diode section 80, an N+ type of buffer region 20 may be provided below the drift region 18. The buffer region 20 has a higher doping concentration than the drift region 18. The buffer region 20 may function as a field stop layer which prevents a depletion layer widening from a lower end of the base region 14 from reaching the P+ type of collector region 22 and the N+ type of cathode region 82. The buffer region 20 may have a plurality of peaks or a single peak in the doping concentration distribution in the depth direction.

In the transistor section 70 and the buffering region 72, the P+ type of collector region 22 is provided below the buffer region 20. In the diode section 80, the N+ type of cathode region 82 is provided below the buffer region 20. The collector region 22 and the cathode region 82 are exposed on the lower surface 23 of the semiconductor substrate 10 and are connected to the collector electrode 24.

The one or more gate trench sections 40 and the one or more dummy trench sections 30 are provided on the upper surface 21 side of the semiconductor substrate 10. Each trench section penetrates the base region 14 to reach the drift region 18 from the upper surface 21 of the semiconductor substrate 10. In a region where at least any one of the emitter region 12, the contact region 15, and the accumulation region 16 is provided, each trench section also penetrates the doping regions of these to reach the drift region 18. A structure in which the trench section penetrates the doping region is not limited to a structure in which the semiconductor substrate is manufactured in order of forming the doping region and then forming the trench section. A structure in which the trench section is formed and then the doping region is formed between the trench sections is also included in the structure in which the trench section penetrates the doping region.

As described above, the transistor section 70 is provided with the gate trench section 40 and the dummy trench section 30. The buffering region 72 and the diode section 80 are provided with the dummy trench section 30, and are not provided with the gate trench section 40.

In this example, a boundary between the diode section 80 and the buffering region 72 in the X axis direction is the boundary between the cathode region 82 and the collector region 22. An end of the transistor section 70 in the X axis direction may be a trench section closest to the diode section 80, among the trench sections in contact with the emitter region 12. In the example of FIG. 3, the dummy trench section 30 is arranged at the end of the transistor section 70 in the X axis direction. A boundary between the transistor section 70 and the buffering region 72 may be located at a center position of the trench section in the X axis direction.

The gate trench section 40 has a gate trench, a gate dielectric film 42, and a gate conductive section 44 which are provided on the upper surface 21 of the semiconductor substrate 10. The gate dielectric film 42 is provided covering an inner wall of the gate trench. The gate dielectric film 42 may be formed by oxidizing or nitriding a semiconductor on the inner wall of the gate trench. The gate conductive section 44 is provided on an inner side further than the gate dielectric film 42 inside the gate trench. That is, the gate dielectric film 42 insulates the gate conductive section 44 from the semiconductor substrate 10. The gate conductive section 44 is formed of a conductive material such as polysilicon.

The gate conductive section 44 may be provided longer than the base region 14 in the depth direction. The gate trench section 40 in the cross section is covered with the interlayer dielectric film 38 on the upper surface 21 of the semiconductor substrate 10. The gate conductive section 44 is electrically connected to the gate runner. In a case where a predetermined gate voltage is applied to the gate conductive section 44, a channel is formed by an electron inversion layer on a surface layer in the base region 14 at an interface in contact with the gate trench section 40.

The dummy trench section 30 may have the same structure as the gate trench section 40 in the cross section. The dummy trench section 30 has a dummy trench, a dummy dielectric film 32, and a dummy conductive section 34 which are provided on the upper surface 21 of the semiconductor substrate 10. The dummy conductive section 34 is electrically connected to the emitter electrode 52. The dummy dielectric film 32 is provided covering an inner wall of the dummy trench. The dummy conductive section 34 is provided inside the dummy trench, and is provided on an inner side further than the dummy dielectric film 32. The dummy dielectric film 32 insulates the dummy conductive section 34 from the semiconductor substrate 10. The dummy conductive section 34 may be formed of the same material as the gate conductive section 44. For example, the dummy conductive section 34 is formed of a conductive material such as polysilicon. The dummy conductive section 34 may have the same length as the gate conductive section 44 in the depth direction.

The gate trench section 40 and the dummy trench section 30 of this example are covered with the interlayer dielectric film 38 on the upper surface 21 of the semiconductor substrate 10. Note that the bottom portions of the dummy trench section 30 and the gate trench section 40 may have curved surfaces which are convex downward (curved line shapes in cross sections).

The diode section 80 has a first upper surface side lifetime control region 141. The first upper surface side lifetime control region 141 is a region where a first valley portion is provided in a carrier lifetime distribution in the depth direction of the semiconductor substrate 10.

The first upper surface side lifetime control region 141 may be provided on the upper surface 21 side of the semiconductor substrate 10. The upper surface 21 side indicates a region between the center and the upper surface 21 in the depth direction of the semiconductor substrate 10. For example, the first upper surface side lifetime control region 141 can be formed by implanting a first impurity such as helium from the upper surface 21 side of the semiconductor substrate 10 at a predetermined range. A first peak portion 151 of a concentration distribution of the first impurity in the depth direction may be provided in the first upper surface side lifetime control region 141. The first upper surface side lifetime control region 141 may be provided on a whole diode section 80 in the X axis direction. In FIG. 3, a peak of an impurity concentration distribution is schematically indicated by an x mark.

The buffering region 72 has a second upper surface side lifetime control region 142. The second upper surface side lifetime control region 142 may be provided on the upper surface 21 side of the semiconductor substrate 10. For example, the second upper surface side lifetime control region 142 can be formed by implanting a second impurity from the upper surface 21 side of the semiconductor substrate 10 at a predetermined range. A second peak portion 152 of a concentration distribution of the second impurity in the depth direction may be provided in the second upper surface side lifetime control region 142. The second upper surface side lifetime control region 142 may be provided on a whole buffering region 72 in the X axis direction.

A width W2 of the second upper surface side lifetime control region 142 in the depth direction is larger than a width W1 of the first upper surface side lifetime control region 141 in the depth direction. A carrier lifetime in a lifetime control region is shortened by a recombination of a carrier with a crystal defect or the like. Therefore, by increasing a range in which the second upper surface side lifetime control region 142 is provided, it is possible to further reduce the carrier lifetime in the buffering region 72. By reducing the carrier lifetime in the buffering region 72, it is possible to suppress a hole injection from the transistor section 70 to the diode section 80. Therefore, it is possible to reduce a reverse recovery loss of the diode section 80. In this example, since the second upper surface side lifetime control region 142 is increased in the depth direction, it is possible to suppress the hole injection without increasing a size of the buffering region 72 on an XY plane. Therefore, both downsizing and a loss reduction of the semiconductor device 100 can be achieved.

A distance between a lower end of the first upper surface side lifetime control region 141 and the lower surface 23 of the semiconductor substrate 10 is set to be L1, and a distance between a lower end of the second upper surface side lifetime control region 142 and the lower surface 23 of the semiconductor substrate 10 is set to be L2. The distance L2 may be shorter than the distance L1. This makes it easy to suppress the hole injection from the upper surface 21 side of the transistor section 70 into the cathode region 82 of the diode section 80.

Figure 4:
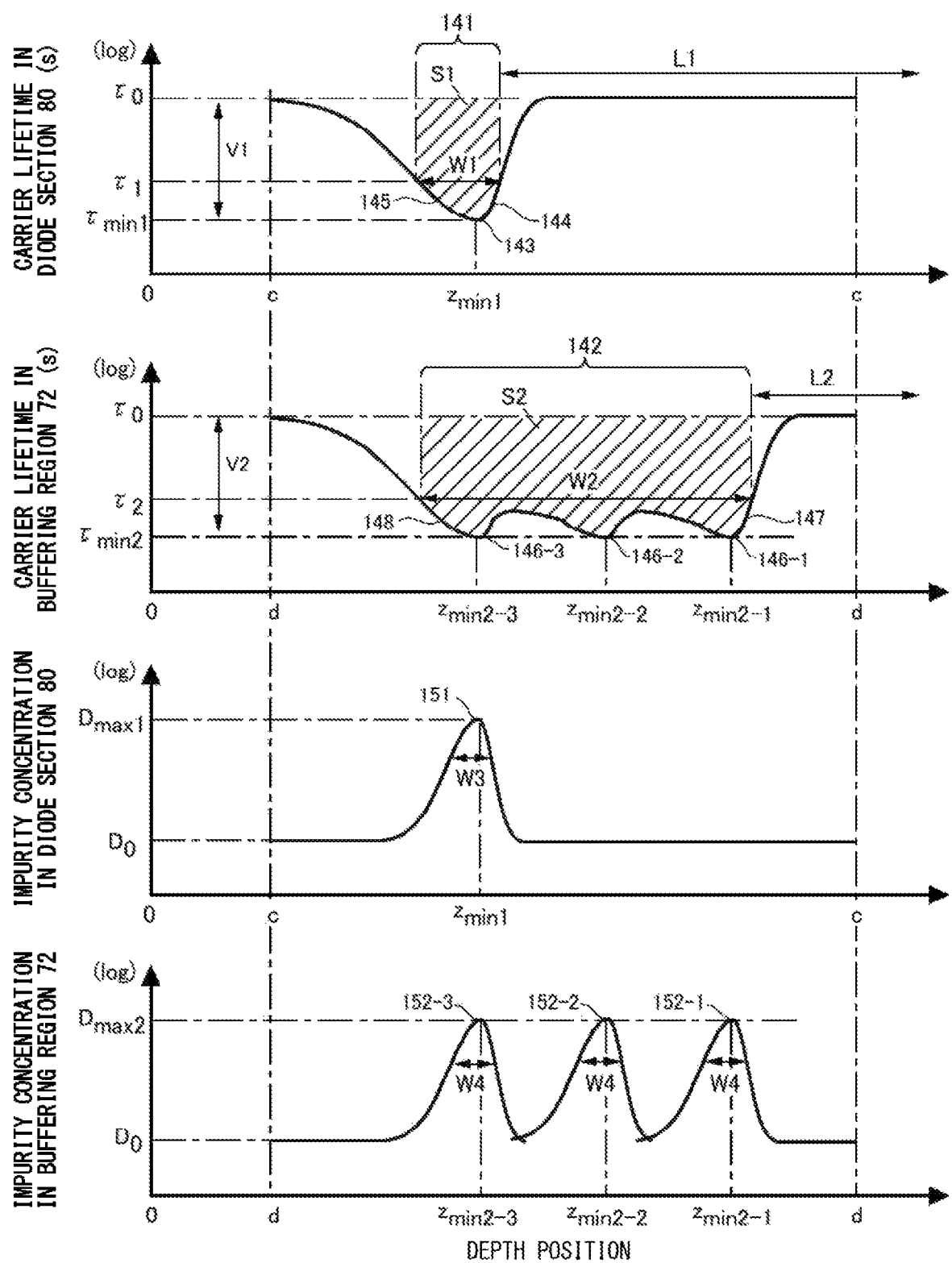
FIG. 4 illustrates graphs showing examples of a carrier lifetime distribution and an impurity concentration distribution in a range c-c and a range d-d in FIG. 3.

FIG. 4 illustrates graphs showing examples of a carrier lifetime distribution and an impurity concentration distribution in a range c-c and a range d-d in FIG. 3. The range c-c is a range in the depth direction which crosses the first upper surface side lifetime control region 141 in the drift region 18 of the diode section 80, and the range d-d is a range in the depth direction which crosses the second upper surface side lifetime control region 142 in the drift region 18 of the buffering region 72. In this example, the range c-c and the range d-d are provided at the same position in the depth direction.

In this example, in a portion where the lifetime control region is not provided in the drift region 18, the carrier lifetime is set to be $\tau_0$, and the impurity concentration is set to be $D_0$. The carrier lifetime $\tau_0$ may be the maximum value of the carrier lifetime in the drift region 18. The impurity concentration $D_0$ may be the minimum value of the impurity concentration in the drift region 18.

A first impurity is implanted into the diode section 80 at a predetermined depth position $z_{min1}$. Thereby, the crystal defect is formed in a vicinity of the depth position $z_{min1}$, and the carrier lifetime is reduced. In this way, a first valley portion 143 is formed in the carrier lifetime distribution. Further, the first peak portion 151 is formed in the concentration distribution of the first impurity in the depth direction, in the diode section 80.

The first valley portion 143 has an upper surface side slope 145 on the upper surface 21 side from a position where the carrier lifetime shows a local minimum value (for example, $z_{min1}$), and a lower surface side slope 144 on a lower surface 23 side from the position. In a case where the impurity is implanted from the upper surface 21 side of the semiconductor substrate 10, the crystal defect is formed also in a region that the impurity has passed. Therefore, the upper surface side slope 145 has a gentler slope than the lower surface side slope 144.

In the specification, a range where the first valley portion 143 is provided is set to be the first upper surface side lifetime control region 141. Further, the local minimum value of the carrier lifetime in the first valley portion 143 is set to be $\tau_{min1}$, and the width of the first upper surface side lifetime control region 141 in the depth direction is set to be W1. The width W1 may be a length from a position where the carrier lifetime has a predetermined value $\tau_1$ on the upper surface side slope 145 to a position where the carrier lifetime has the predetermined value $\tau_1$ on the lower surface side slope 144. The predetermined value $\tau_1$ is, for example, a value obtained by adding a value corresponding to V1=$\tau_0$-$\tau_{min1}$, which is a depth of a valley in the first valley portion 143, to the local minimum value $\tau_{min1}$. The predetermined value $\tau_1$ may be $\tau_{min1}+0.5\times V1$ (that is, full width at half maximum of the first valley portion 143), may be $\tau_{min1}+0.9\times V1$, and may be $\tau_{min1}+0.99\times V1$.

The second impurity is implanted into the buffering region 72 at a predetermined depth position. In the buffering region 72 of this example, the second impurities are implanted into a plurality of positions $z_{min2-1}$, $z_{min2-2}$, and $z_{min2-3}$ in different depth directions. In this way, the crystal defect is formed in a vicinity of each of the depth positions $z_{min2-1}$, $z_{min2-2}$, and $z_{min2-3}$, and the carrier lifetime is reduced. Further, in the concentration distribution of the second impurity in the depth direction in the buffering region 72, the second peak portions, 152-1, 152-2, and 152-3, are formed, the number of which being more than that of the first peak portion 151.

Second valley portions 146-1, 146-2, and 146-3 of the carrier lifetime distribution are formed at the depth positions $z_{min2-1}$, $z_{min2-2}$, and $z_{min2-3}$, respectively. In this example, the respective second valley portions 146-1, 146-2, and 146-3 are collectively treated as one second valley portion 146. Each of the second valley portions 146-1, 146-2, and 146-3 may have an overlapping slope.

In this example, an upper surface side slope 148 of the second valley portion 146-3 closest to the upper surface 21 side, and a lower surface side slope 147 of the second valley portion 146-1 closest to the lower surface 23 side are treated as an upper surface side slope and a lower surface side slope of a whole second valley portion 146, respectively. The upper surface side slope 148 may have a gentler slope than the lower surface side slope 147.

In the specification, a range where the second valley portion 146 is provided is set to be the second upper surface side lifetime control region 142. Further, a local minimum value of the carrier lifetime in the second valley portion 146 is set to be $\tau_{min2}$, and the width of the second upper surface side lifetime control region 142 in the depth direction is set to be W2. The width W2 may be a length from a position where the carrier lifetime has a predetermined value $\tau_2$ on the upper surface side slope 148 to a position where the carrier lifetime has the predetermined value $\tau_2$ on the lower surface side slope 147. The predetermined value $\tau_2$ is, for example, a value obtained by adding a value corresponding to V2=$\tau_0$-$\tau_{min2}$, which is a depth of a valley in the second valley portion 146, to the local minimum value $\tau_{min2}$. The predetermined value $\tau_2$ may be $\tau_{min2}+0.5\times V2$ (that is, full width at half maximum of the second valley portion 146), may be $\tau_{min2}+0.9\times V2$, and may be $\tau_{min2}+0.99\times V2$.

In this example, the second impurity is implanted into a plurality of positions in the depth direction. In this case, the number of the second peak portions 152 in the second upper surface side lifetime control region 142 may be more than the number of the first peak portions 151 in the first upper surface side lifetime control region 141. By implanting the second impurity into the plurality of positions in the depth direction, it is possible to easily form the second upper surface side lifetime control region 142 wider, in the depth direction, than the first upper surface side lifetime control region 141. Note that in the second upper surface side lifetime control region 142, a portion from the depth position $z_{min2-1}$ to $z_{min2-3}$ may not include a region where the carrier lifetime is longer than $\tau_2$. In this case, a change in the carrier lifetime in the portion can be suppressed. Further, in the second upper surface side lifetime control region 142, the portion from the depth position $z_{min2-1}$ to $z_{min2-3}$ may include a region where the carrier lifetime is longer than $\tau_2$. By adjusting the depth positions $z_{min2-1}$, $z_{min2-2}$, and $z_{min2-3}$, any form of carrier lifetime distribution can be made.

It is preferable that an area S2 of the carrier lifetime distribution in the second valley portion 146 is greater than an area S1 of the carrier lifetime distribution in the first valley portion 143. Each area is an area of a region hatched with diagonal lines in FIG. 4. That is, in each valley portion, the area is an area of a region interposed between a $\tau_0$ line and each carrier lifetime distribution line. This makes it easy to reduce the carrier lifetime, in the second upper surface side lifetime control region 142.

The local minimum value $\tau_{min2}$ of the carrier lifetime in the second valley portion 146 may be smaller than the local minimum value $\tau_{min1}$ of the carrier lifetime in the first valley portion 143. This makes it easy to reduce the carrier lifetime, in the second upper surface side lifetime control region 142. Note that the local minimum value $\tau_{min2}$ may be the same as the local minimum value $\tau_{min1}$, or may be greater than the local minimum value $\tau_{min1}$.

The first impurity implanted into the diode section 80 may be the same as or different from the second impurity implanted into the buffering region 72. The first impurity is, for example, helium. The second impurity is, for example, at least one of helium and a proton. In a case where the first impurity is the same as the second impurity, a width W3 of the first peak portion 151 may be the same as a width W4 of the second peak portion 152. The width of the peak portion may be the full width at half maximum. A variation in the range of the impurity changes depending on a mass of the impurity. In a case where the first impurity is different from the second impurity, the width W3 may be different from the width W4.

A local maximum value $D_{max2}$ of the second peak portion 152 may be greater than a local maximum value $D_{max1}$ of the first peak portion 151. This makes it easy to reduce the carrier lifetime, in the second upper surface side lifetime control region 142. Note that the local maximum value $D_{max2}$ of the second peak portion 152 may be the same as or smaller than the local maximum value $D_{max1}$ of the first peak portion 151. Further, the respective local maximum values $D_{max2}$ of a plurality of second peak portions 152 may be different from each other, or may be the same.

Further, the second impurities implanted into the respective depth positions $z_{min2-1}$, $z_{min2-2}$, and $z_{min2-3}$ may be the same, or may be different from each other. For example, the impurity implanted into the depth position $z_{min2-1}$ closest to the lower surface 23 side may be an element with a smaller atomic number than the impurity implanted into the depth position $z_{min2-3}$ closest to the upper surface 21 side. This makes it easy to implant the impurity into up to a position where the distance from the upper surface 21 is long. As an example, the impurity implanted into the depth position $z_{min2-3}$ closest to the upper surface 21 side is helium, and the impurity implanted into the depth position $z_{min2-1}$ closest to the lower surface 23 side is hydrogen (the proton). The impurity implanted into the intermediate depth position $z_{min2-2}$ may be helium or hydrogen. The impurity implanted into the depth position $z_{min2-3}$ closest to the upper surface 21 side may be the same as the first impurity. The impurity implanted into the depth position $z_{min2-1}$ closest to the lower surface 23 side may be different from the first impurity. The impurity implanted into the intermediate depth position $z_{min2-2}$ may be the same as or different from the first impurity.

Further, the depth position $z_{min2-3}$ closest to the upper surface 21 side may be the same depth position as the depth position $z_{min1}$ in the first valley portion 143. In this case, the impurity implanted into the depth position $z_{min2-3}$ may be the same element as the impurity implanted into the depth position $z_{min1}$. For example, the impurity is helium or the proton. This can implant the second impurity into the buffering region 72 as well, in the process of implanting the first impurity into the diode section 80. Note that the same impurity as the second impurity implanted into the buffering region 72 may be implanted merely into a side of diode section 80, the side being in direct contact with to the buffering region 72. In this case, the first valley portion 143 of the first upper surface side lifetime control region 141 may be based on the impurity implanted into the center of the diode section 80, without taking account of the same impurity as the second impurity locally implanted into the side of the diode section 80, the side being in direct contact with the buffering region 72.

Note that in the transistor section 70, the lifetime control region may not be provided on the upper surface 21 side. That is, in the transistor section 70, the carrier lifetime at the same depth position as the second valley portion 146 is longer than the carrier lifetime in the second valley portion 146. The carrier lifetime in the transistor section 70 is, for example, $\tau_0$. This can suppress a damage to the gate dielectric film 42 or the like in the gate trench section 40, the damage occurring in a case where the impurity is implanted from the upper surface 21 side.

Figure 5:
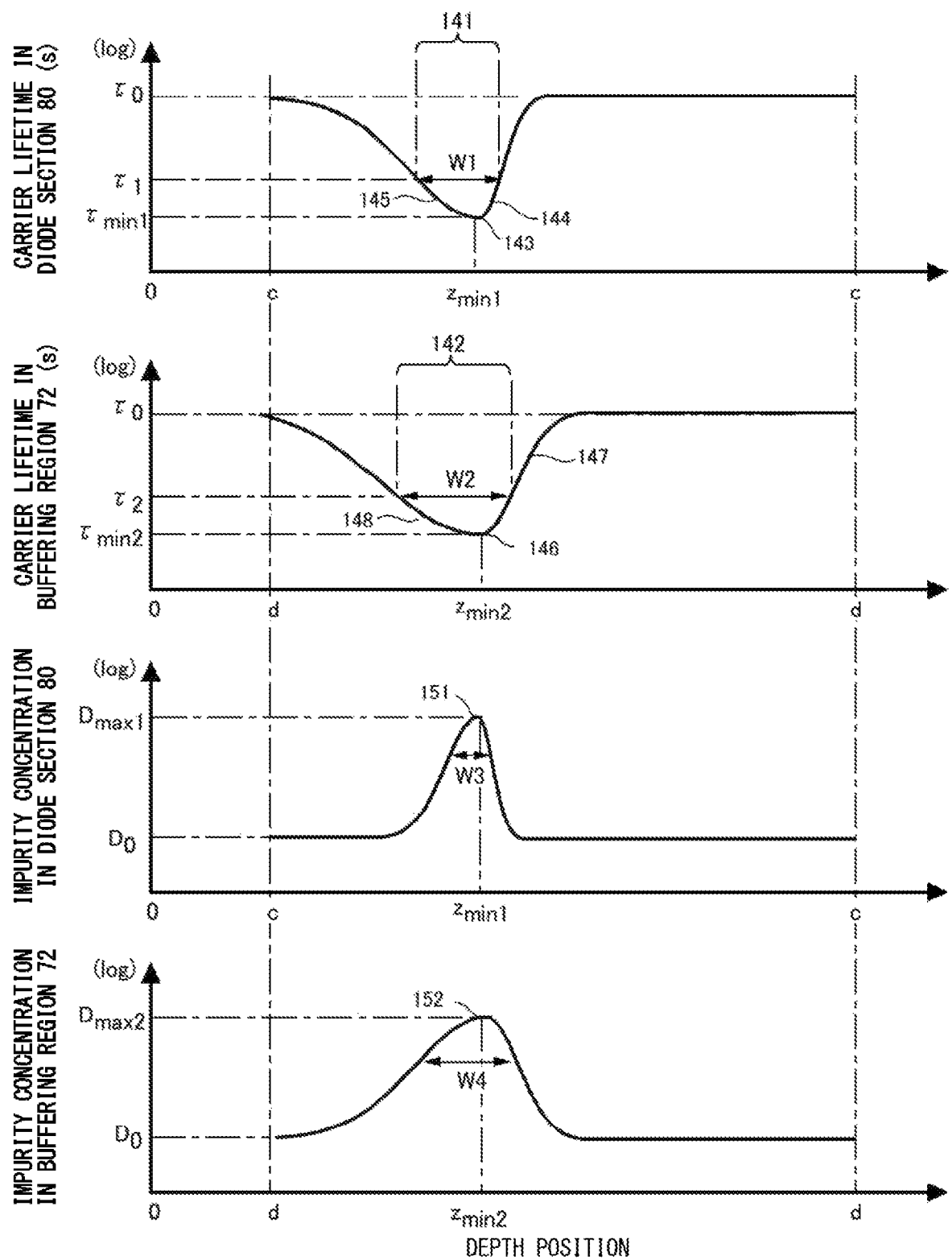
FIG. 5 illustrates graphs showing other examples of the carrier lifetime distribution and the impurity concentration distribution in the range c-c and the range d-d in FIG. 3.

FIG. 5 illustrates graphs showing other examples of the carrier lifetime distribution and the impurity concentration distribution in the range c-c and the range d-d in FIG. 3. In this example, the carrier lifetime distribution and the impurity concentration distribution in the diode section 80 are the same as those in the example of FIG. 4.

In this example, the second upper surface side lifetime control region 142 has the one second valley portion 146 and the one second peak portion 152. The second upper surface side lifetime control region 142 may be formed by implanting the second impurity at the one position $z_{min2}$ in the depth direction. The depth position $z_{min2}$ may be the same as or different from the depth position $z_{min1}$.

The second impurity different from the first impurity may be implanted into the second upper surface side lifetime control region 142. The second impurity may be an element with a smaller atomic number than the first impurity. As the mass of the impurity implanted into the semiconductor substrate 10 is small, the impurity is easily affected by scattering or the like in the substrate, and is distributed over a wide range in the depth direction. Therefore, by using the second impurity which is lighter than the first impurity, it is possible to easily distribute the second impurity over the wide range, and to easily form the wide second upper surface side lifetime control region 142.

In this example, the width W4 of the second peak portion 152 is larger than the width W3 of the first peak portion 151. Accordingly, the width W2 of the second valley portion 146 is also larger than the width W1 of the first valley portion 143.

Figure 6:
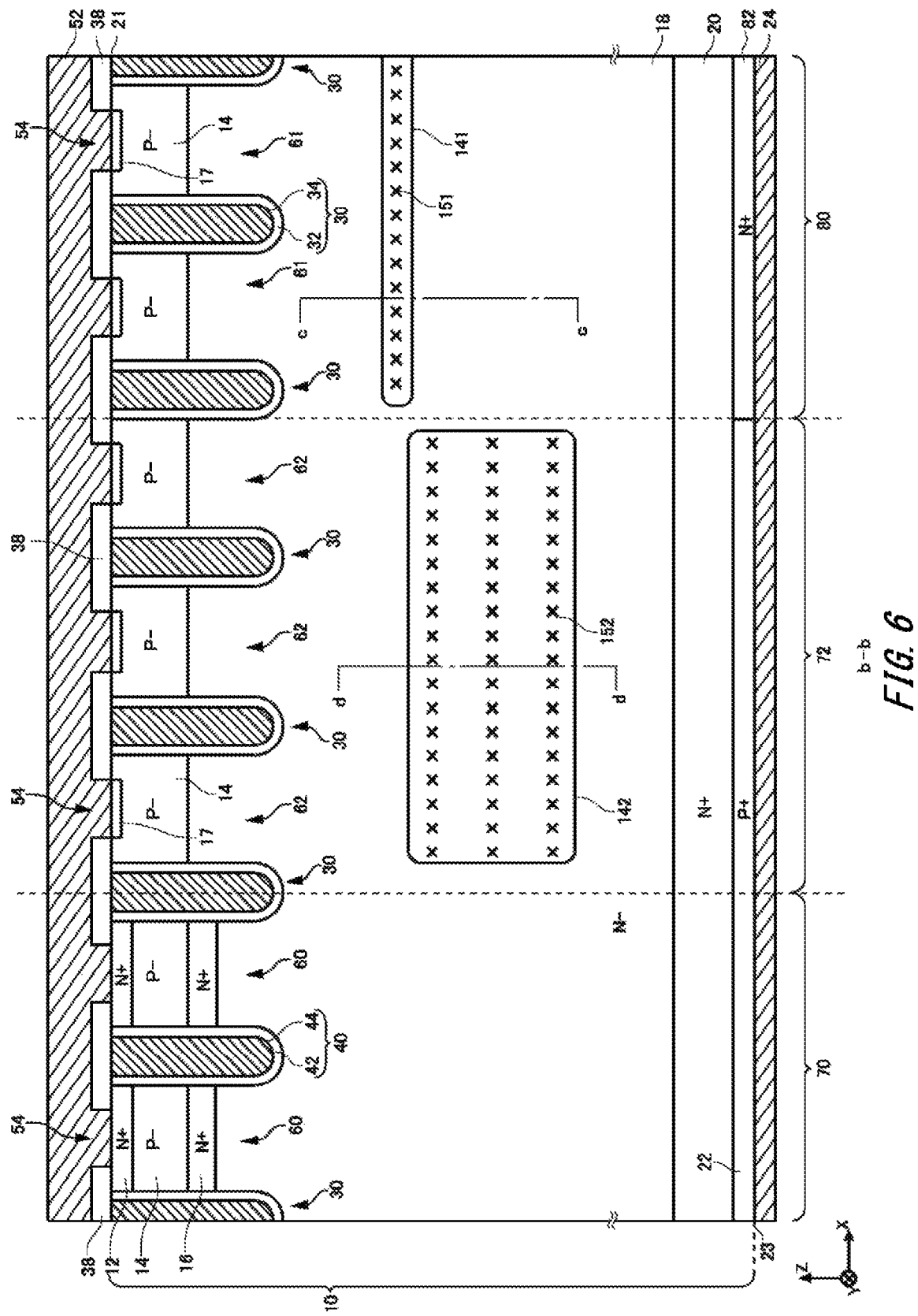
FIG. 6 illustrates other examples of arrangements of a first upper surface side lifetime control region 141 and a second upper surface side lifetime control region 142.

FIG. 6 is a view showing other examples of arrangements of a first upper surface side lifetime control region 141 and a second upper surface side lifetime control region 142. In this example, an upper end of the second upper surface side lifetime control region 142 is arranged below an upper end of the first upper surface side lifetime control region 141. With such a configuration, it is possible to suppress flowing of a hole into the cathode region 82 from the upper surface 21 side of the transistor section 70.

Figure 7:
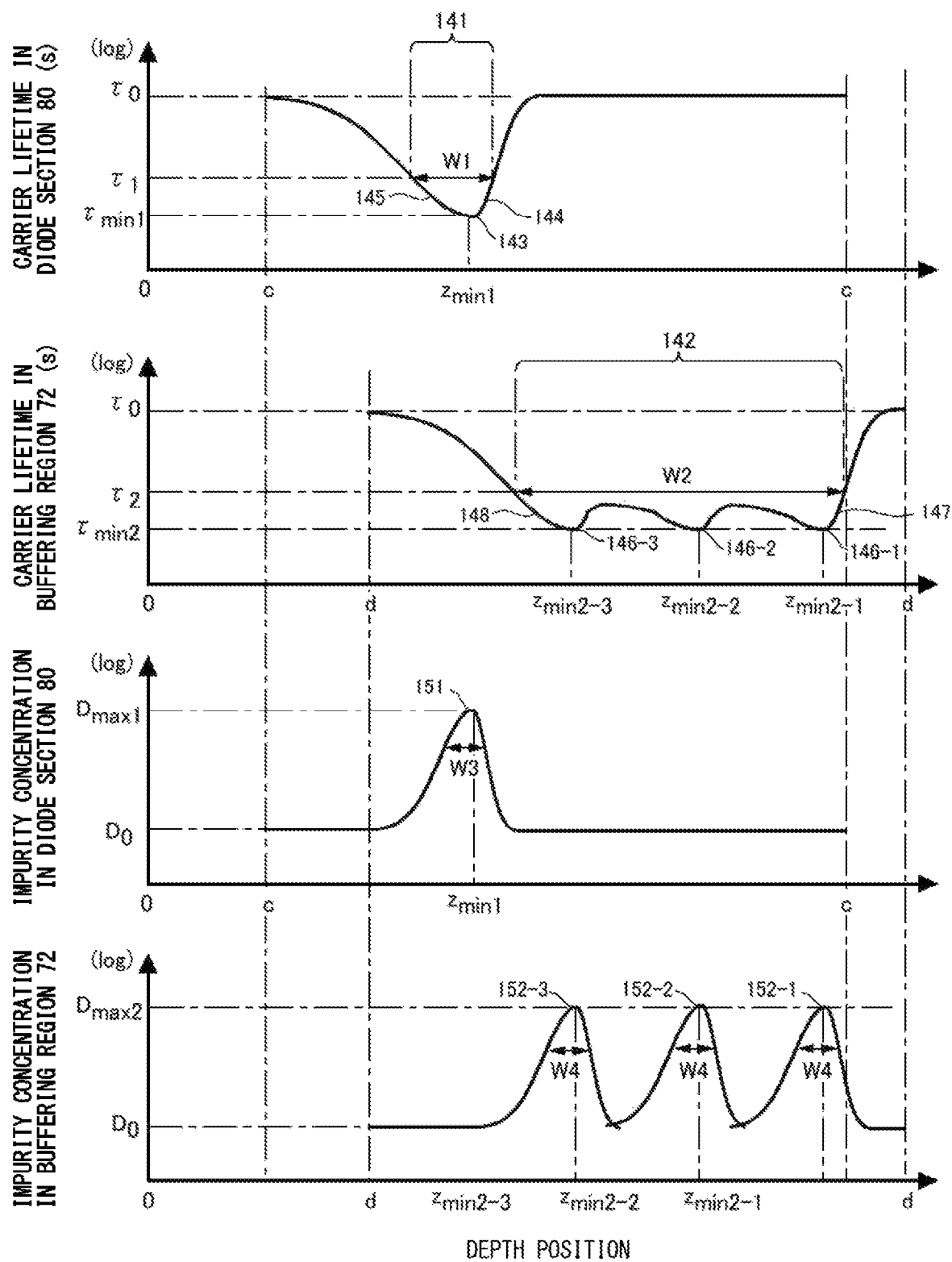
FIG. 7 illustrates graphs showing examples of a carrier lifetime distribution and an impurity concentration distribution in a range c-c and a range d-d in FIG. 6.

FIG. 7 illustrates graphs showing examples of a carrier lifetime distribution and an impurity concentration distribution in a range c-c and a range d-d in FIG. 6. In this example, the carrier lifetime distribution and the impurity concentration distribution in the diode section 80 are the same as those in the example of FIG. 4.

In this example, any of the depth positions $z_{min2}$ into which the second impurities are implanted is arranged below the depth position $z_{min1}$ into which the first impurity is implanted. In this way, the upper end of the second upper surface side lifetime control region 142 is arranged below the upper end of the first upper surface side lifetime control region 141. A configuration of the second upper surface side lifetime control region 142, other than the depth position $z_{min2}$, may be the same as that of the second upper surface side lifetime control region 142 described with reference to FIG. 4 or FIG. 5.

Figure 8:
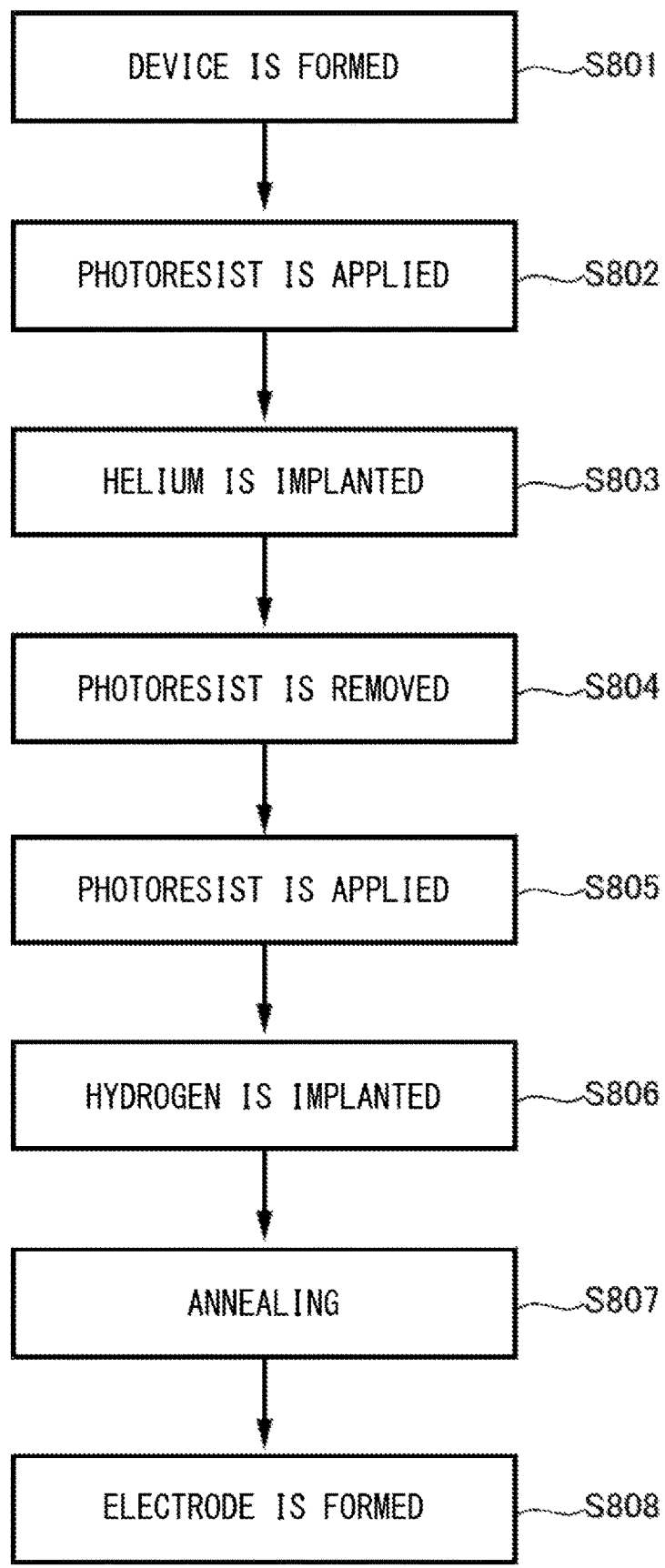
FIG. 8 is a flowchart describing some steps in a method of manufacturing the semiconductor device 100.

FIG. 8 is a flowchart describing some steps in a method of manufacturing the semiconductor device 100. In the method, first, a device structure is formed on the semiconductor substrate 10 (S801). The device structure may be a structure on the upper surface 21 side of the semiconductor substrate 10. The device structure may include each trench section and each mesa section. The device structure may include the dielectric film, the electrode, and the like above the upper surface 21 of the semiconductor substrate 10.

Subsequently, in the implanting steps S802 to S806, the impurities are implanted into the diode section 80 and the buffering region 72 under different conditions. In the implanting steps, in the diode section 80 and the buffering region 72, impurities may be implanted to different depth positions, or different kinds of impurities may be used. In this example, helium is implanted into the diode section 80, and a hydrogen ion (for example, the proton) is implanted into the buffering region 72.

In a case where helium is implanted into the diode section 80, photoresist is applied on the upper surface 21 of the semiconductor substrate 10, and the photoresist in a region where the first upper surface side lifetime control region 141 is to be formed is removed (S802). After the photoresist is removed, a helium ion is implanted from the upper surface 21 side of the semiconductor substrate 10 (S803). After the helium ion is implanted, the remaining photoresist is removed (S804).

In a case where hydrogen is implanted into the buffering region 72, photoresist is applied on the upper surface 21 of the semiconductor substrate 10, and the photoresist in a region where the second upper surface side lifetime control region 142 is to be formed is removed (S805). After the photoresist is removed, the hydrogen ion such as the proton is implanted from the upper surface 21 side of the semiconductor substrate 10 (S806). In this example, protons are sequentially implanted into the three depth positions. After the proton is implanted, the remaining photoresist is removed.

Either the helium ion implantation or the proton implantation may be performed first. After the helium ion and the proton are implanted, the semiconductor substrate 10 is annealed (S807). Thereby, the first upper surface side lifetime control region 141 and the second upper surface side lifetime control region 142 are formed. Further, an excessively formed crystal defect is recovered. After the annealing, the collector electrode 24 is formed (S808). In this way, the semiconductor device 100 can be manufactured.

While the embodiments of the present invention have been described, the technical scope of the invention is not limited to the scope according to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

It should be noted that each process of the operations, procedures, steps, stages and the like performed by an apparatus, system, program, and method shown in the claims, the specification, or drawings can be performed in any order as long as the order is not indicated by "prior to," "before," or the like and as long as the output from a previous process is not used in a later process. Even if the process flow is described using phrases such as "first" or "next" in the claims, the specification, and drawings, it does not necessarily mean that the process must be performed in this order.

EXPLANATION OF REFERENCES

10: semiconductor substrate, 11: well region, 12: emitter region, 14: base region, 15: contact region, 16: accumulation region, 17: plug region, 18: drift region, 20: buffer region, 21: upper surface, 22: collector region, 23: lower surface, 24: collector electrode, 29: linear portion, 30: dummy trench section, 31: edge portion, 32: dummy dielectric film, 34: dummy conductive section, 38: interlayer dielectric film, 39: linear portion, 40: gate trench section, 41: edge portion, 42: gate dielectric film, 44: gate conductive section, 52: emitter electrode, 54: contact hole, 60, 61, 62: mesa section, 70: transistor section, 72: buffering region, 80: diode section, 81: extension region, 82: cathode region, 90: edge termination structure section, 100: semiconductor device, 102: edge side, 112: gate pad, 120: active section, 130: outer circumferential gate runner, 131: active-side gate runner, 141: first upper surface side lifetime control region, 142: second upper surface side lifetime control region, 143: first valley portion, 144: lower surface side slope, 145: upper surface side slope, 146: second valley portion, 147: lower surface side slope, 148: upper surface side slope, 151: first peak portion, 152: second peak portion

What is claimed is:

1. A semiconductor device comprising:
a semiconductor substrate having a first conductivity type of drift region;
a transistor section having a gate trench section on an upper surface of the semiconductor substrate;
a diode section having a first conductivity type of cathode region on a lower surface of the semiconductor substrate, the cathode region having a higher doping concentration than the drift region; and
a buffering region arranged between the transistor section and the diode section,
wherein the diode section has a first upper surface side lifetime control region where a first valley portion is provided in a carrier lifetime distribution in a depth direction of the semiconductor substrate, and
wherein the buffering region has a second upper surface side lifetime control region where a second valley portion is provided in the carrier lifetime distribution, the second valley portion being wider, in the depth direction, than the first valley portion.

2. The semiconductor device according to claim 1,
wherein the first upper surface side lifetime control region includes a first impurity, and
wherein the second upper surface side lifetime control region includes a second impurity different from the first impurity.

3. The semiconductor device according to claim 2,
wherein a concentration distribution of the first impurity in the depth direction has a first peak portion, and
wherein a concentration distribution of the second impurity in the depth direction has a second peak portion, the second peak portion being wider than the first peak portion.

4. The semiconductor device according to claim 2,
wherein the first impurity is helium, and
wherein the second impurity is a proton.

5. The semiconductor device according to claim 1,
wherein the second upper surface side lifetime control region includes the same impurity as the first upper surface side lifetime control region.

6. The semiconductor device according to claim 1,
wherein the number of peaks of an impurity concentration distribution in the second upper surface side lifetime control region is more than the number of peaks of an impurity concentration distribution in the first upper surface side lifetime control region.

7. The semiconductor device according to claim 1,
wherein in the transistor section, a carrier lifetime at the same depth position as the second valley portion is longer than a carrier lifetime in the second valley portion.

8. The semiconductor device according to claim 1,
wherein a distance between a lower end of the second upper surface side lifetime control region and the lower surface of the semiconductor substrate is shorter than a distance between a lower end of the first upper surface side lifetime control region and the lower surface of the semiconductor substrate.

9. A semiconductor device comprising:
a semiconductor substrate having a first conductivity type of drift region;
a transistor section having a gate trench section on an upper surface of the semiconductor substrate;
a diode section having a first conductivity type of cathode region on a lower surface of the semiconductor substrate, the cathode region having a higher doping concentration than the drift region; and
a buffering region arranged between the transistor section and the diode section,
wherein the diode section has a first upper surface side lifetime control region where a first valley portion is provided in a carrier lifetime distribution in a depth direction of the semiconductor substrate,
wherein the buffering region has a second upper surface side lifetime control region where a second valley portion is provided in the carrier lifetime distribution,
wherein the first upper surface side lifetime control region includes a first impurity, and
wherein the second upper surface side lifetime control region includes a second impurity different from the first impurity.

10. A method of manufacturing a semiconductor device comprising a semiconductor substrate having a first conductivity type of drift region; a transistor section having a gate trench section on an upper surface of the semiconductor substrate; a diode section having a first conductivity type of cathode region on a lower surface of the semiconductor substrate, the cathode region having a higher doping concentration than the drift region; and a buffering region arranged between the transistor section and the diode section, the method comprising:
implanting an impurity into each of the diode section and the buffering region under different conditions; and
annealing the semiconductor substrate to form, in the diode section, a first upper surface side lifetime control region where a first valley portion is provided in a carrier lifetime distribution in a depth direction of the semiconductor substrate, and to form, in the buffering region, a second upper surface side lifetime control region where a second valley portion is provided in the carrier lifetime distribution, the second valley portion being wider than the first valley portion.

* * * * *